US011720289B2

(12) United States Patent
Ish

(10) Patent No.: US 11,720,289 B2
(45) Date of Patent: *Aug. 8, 2023

(54) BLOCK FAMILY TRACKING FOR MEMORY DEVICES

(71) Applicant: Micron Technology, Inc., Boise, ID (US)

(72) Inventor: Mark Ish, San Ramon, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/722,856

(22) Filed: Apr. 18, 2022

(65) Prior Publication Data

US 2022/0236920 A1   Jul. 28, 2022

Related U.S. Application Data

(63) Continuation of application No. 16/854,282, filed on Apr. 21, 2020, now Pat. No. 11,347,434.

(51) Int. Cl.
  *G06F 3/06* (2006.01)
  *G11C 16/26* (2006.01)
  *G11C 16/04* (2006.01)

(52) U.S. Cl.
  CPC .......... *G06F 3/0659* (2013.01); *G06F 3/0604* (2013.01); *G06F 3/064* (2013.01); *G06F 3/0679* (2013.01); *G11C 16/26* (2013.01); *G11C 16/0483* (2013.01)

(58) Field of Classification Search
  CPC ...... G06F 3/0604; G06F 3/064; G06F 3/0659; G06F 3/0679; G11C 7/04; G11C 11/5642; G11C 16/0483; G11C 16/08; G11C 16/10; G11C 16/26; G11C 16/349
  See application file for complete search history.

(56) References Cited

U.S. PATENT DOCUMENTS

| 9,437,320 | B1 | 9/2016 | Nguyen et al. |
| 2016/0124641 | A1 | 5/2016 | Kim et al. |
| 2016/0328183 | A1 | 11/2016 | Hsieh |
| 2021/0191617 | A1* | 6/2021 | Sheperek ................. G11C 7/20 |

* cited by examiner

*Primary Examiner* — Larry T Mackall
(74) *Attorney, Agent, or Firm* — Lowenstein Sandler LLP

(57) ABSTRACT

An example memory sub-system includes a memory device and a processing device, operatively coupled to the memory device. The processing device is configured to receive a read command specifying an identifier of a logical block and a page number; translate the identifier of the logical block into a physical address of a physical block stored on the memory device, wherein the physical address comprises an identifier of a memory device die; identify, based on block family metadata associated with the memory device, a block family associated with the physical block and the page number; determine a threshold voltage offset associated with the block family and the memory device die; compute a modified threshold voltage by applying the threshold voltage offset to a base read level voltage associated with the memory device die; and read, using the modified threshold voltage, data from a physical page identified by the page number within the physical block.

20 Claims, 12 Drawing Sheets

Bin table 810

| Index | Die 0 bin | Die 1 bin | ... | Die N bin |
|---|---|---|---|---|
| 1 | 5 | 6 | ... | 4 |
| 2 | 4 | 2 | | 5 |
| 3 | | | | |
| 4 | 3 | | | |
| 5 | | | | |
| ... | | | | |
| ... | | | | |
| 20 | | | | |
| 21 | | | | |
| 22 | | | | |
| ... | | | | |
| 62 | | | | |
| 63 | | | | |
| 64 | | | | |

Offset table 820

| Offset Select | TLC 1 | TLC 2 | TLC 3 | TLC 4 | TLC 5 | TLC 6 | TLC 7 | MLC 1 | MLC 2 | MLC 3 | SLC |
|---|---|---|---|---|---|---|---|---|---|---|---|
| 1 | 0 | 1 | 1 | -3 | -2 | -3 | -4 | 0 | 2 | 2 | |
| 2 | | | | | | | | | | | |
| 3 | | | | | | | | | | | |
| ... | ... | ... | ... | ... | ... | ... | ... | ... | ... | ... | ... |
| 64 | | | | | | | | | | | |

FIG. 8

BLOCK FAMILY TRACKING FOR MEMORY DEVICES

RELATED APPLICATIONS

This application is a continuation of U.S. patent application Ser. No. 16/854,282 filed on Apr. 21, 2020, which is incorporated by reference herein.

TECHNICAL FIELD

Embodiments of the disclosure are generally related to memory sub-systems, and more specifically, are related to block family-based error avoidance for memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

FIG. 8 schematically illustrates example metadata maintained by the memory sub-system controller for associating block families with voltage offset bins and corresponding threshold voltage offsets, in accordance with embodiments of the present disclosure.

DETAILED DESCRIPTION

Figure 1:
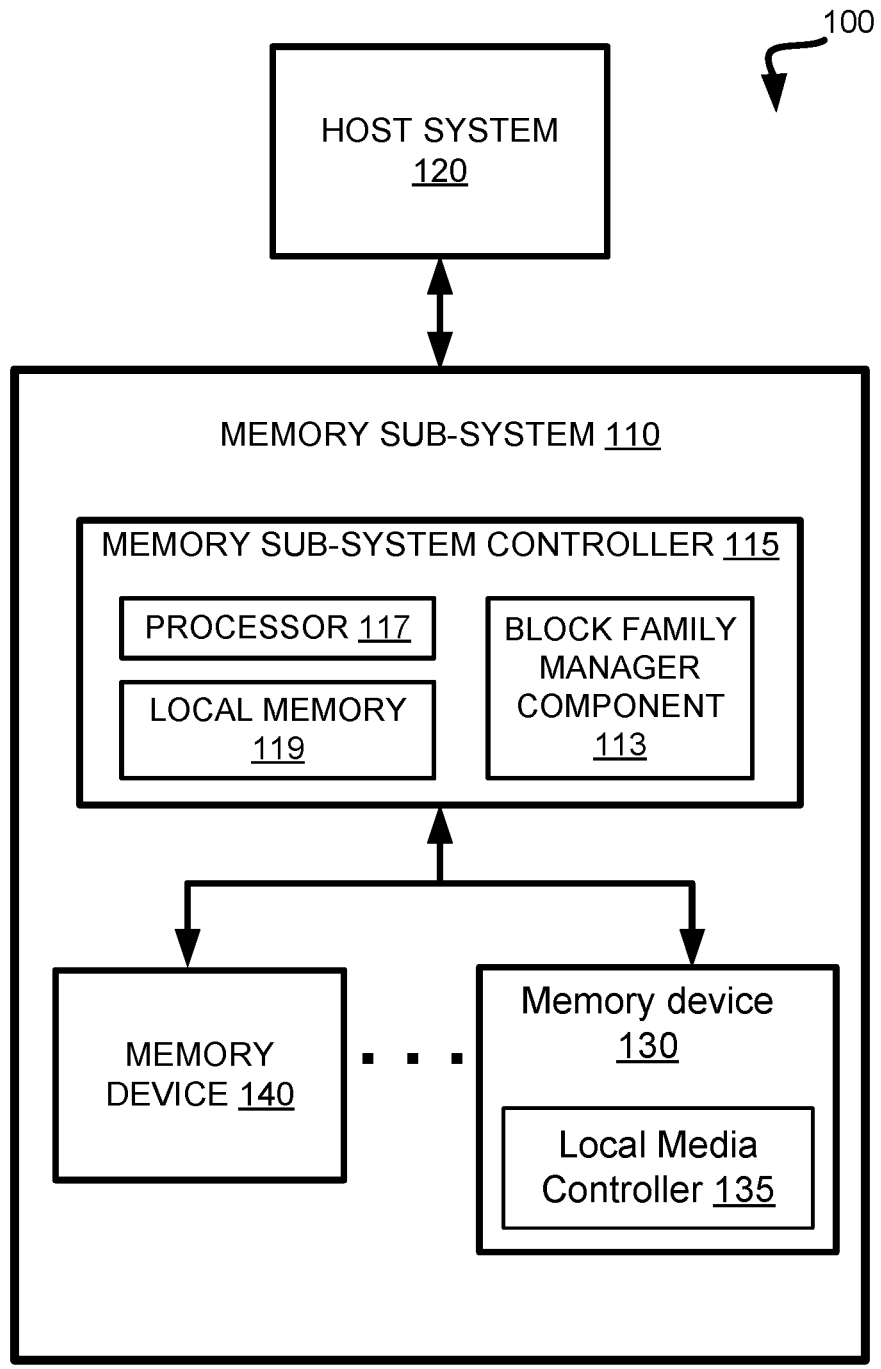
FIG. 1 illustrates an example computing system that includes a memory sub-system in accordance with some embodiments of the present disclosure.

Embodiments of the present disclosure are directed to block family-based error avoidance for memory devices. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, non-volatile memory devices can be provided by negative-and (NAND) type flash memory devices. Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data". A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g. used to distinguish age of data written), valid bitmap (which LBAs or logical transfer units contain valid data), etc.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information. "Threshold voltage" herein shall refer to the voltage level that defines a boundary between two neighboring voltage distributions corresponding to two logical levels. Thus, the read operation can be performed by comparing the measured voltage exhibited by the memory cell to one or more reference voltage levels in order to distinguish between two logical levels for single-level cells and between multiple logical levels for multi-level cells.

Due to the phenomenon known as slow charge loss, the threshold voltage of a memory cell changes in time as the electric charge of the cell is degrading, which is referred to as "temporal voltage shift" (since the degrading electric charge causes the voltage distributions to shift along the voltage axis towards lower voltage levels). The threshold voltage is changing rapidly at first (immediately after the memory cell was programmed), and then slows down in an approximately logarithmic linear fashion with respect to the time elapsed since the cell programming event. Accordingly, failure to mitigate the temporal voltage shift caused by the slow charge loss can result in the increased bit error rate in read operations.

However, various common implementations either fail to adequately address the temporal voltage shift or employ inefficient strategies resulting in high bit error rates and/or exhibiting other shortcomings. Embodiments of the present disclosure address the above-noted and other deficiencies by implementing a memory sub-system that employs block family based error avoidance strategies, thus significantly improving the bit error rate exhibited by the memory sub-system.

In accordance with embodiments of the present disclosure, the temporal voltage shift is selectively tracked for programmed blocks grouped by block families, and appropriate voltage offsets, which are based on block affiliation with a certain block family, are applied to the base read levels in order to perform read operations. "Block family" herein shall refer to a set of blocks (which can include one or more full and/or partial blocks, the latter referred to as "partitions" herein) that have been programmed within a specified time window and a specified temperature window. Since the time elapsed after programming and temperature are the main factors affecting the temporal voltage shift, all blocks and/or partitions within a single block family are presumed to exhibit similar distributions of threshold voltages in memory cells, and thus would require the same voltage offsets to be applied to the base read levels for read operations. "Base read level" herein shall refer to the initial threshold voltage level exhibited by the memory cell immediately after programming. In some implementations, base read levels can be stored in the metadata of the memory device.

Block families can be created asynchronously with respect to block programming events. In an illustrative example, a new block family can be created whenever a specified period of time (e.g., a predetermined number of minutes) has elapsed since creation of the last block family or the reference temperature of memory cells has changed by more than a specified threshold value. The memory sub-system controller can maintain an identifier of the active block family, which is associated with one or more blocks as they are being programmed.

The memory sub-system controller can periodically perform a calibration process in order to associate each die of every block family with one of the predefined threshold voltage offset bins, which is in turn associated with the voltage offset to be applied for read operations. The associations of blocks with block families and block families and dies with threshold voltage offset bins can be stored in respective metadata tables maintained by the memory sub-system controller.

In some implementations, associations of full or partial blocks (partitions) with block families can be stored by a combination of a block family table and a linked list of partition groups. The block family table, which is indexed by the block number, stores, for each block, the block family associated with the first partition of the block, the ending page offset of the first partition of the block, and a link to the first group of the partition (i.e., the index of the first group of the partition in the group table). Each group includes up to a predetermined number (e.g., seven) of partitions, such that the group table specifies, for each partition, its block family association, its ending page offset, and the skip page offset for implementing the binary search within each group, as described in more detail herein below with reference to FIGS. 7-9.

Accordingly, upon receiving a read command, the memory sub-system controller can identify the block family associated with the memory page identified by the logical address specified by the read command, identify the threshold voltage offset bin associated with the block family and die on which the block resides, compute the new threshold voltage by additively applying the threshold voltage offset associated with the threshold voltage offset bin to the base read level, and perform the read operation using the new threshold voltage, as described in more detail herein below.

Therefore, advantages of the systems and methods implemented in accordance with some embodiments of the present disclosure include, but are not limited to, improving the bit error rate in read operations by maintaining metadata tracking groups of blocks (block families) that are presumed to exhibit similar voltage distributions and selectively performing calibration operations for limited subsets of blocks based on their block family association, as described in more detail herein below.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device (e.g., a processor).

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

In some implementations, memory sub-system 110 can use a striping scheme, according to which every the data payload (e.g., user data) utilizes multiple dies of the memory devices 130 (e.g., NAND type flash memory devices), such that the payload is distributed through a subset of dies, while the remaining one or more dies are used to store the error correction information (e.g., parity bits). Accordingly, a set of blocks distributed across a set of dies of a memory device using a striping scheme is referred herein to as a "super-block."

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a block family manager component 113 that can be used to implement the block family-based error avoidance strategies in accordance with embodiments of the present disclosure. In some embodiments, the controller 115 includes at least a portion of the block family manager component 113. For example, the controller 115 can include a processor 117 (processing device) configured to execute instructions stored in local memory 119 for performing the operations described herein. In some embodiments, the block family manager component 113 is part of the host system 120, an application, or an operating system. The block family manager component 113 can manage block families associated with the memory devices 130, as described in more detail herein below.

Figure 2:
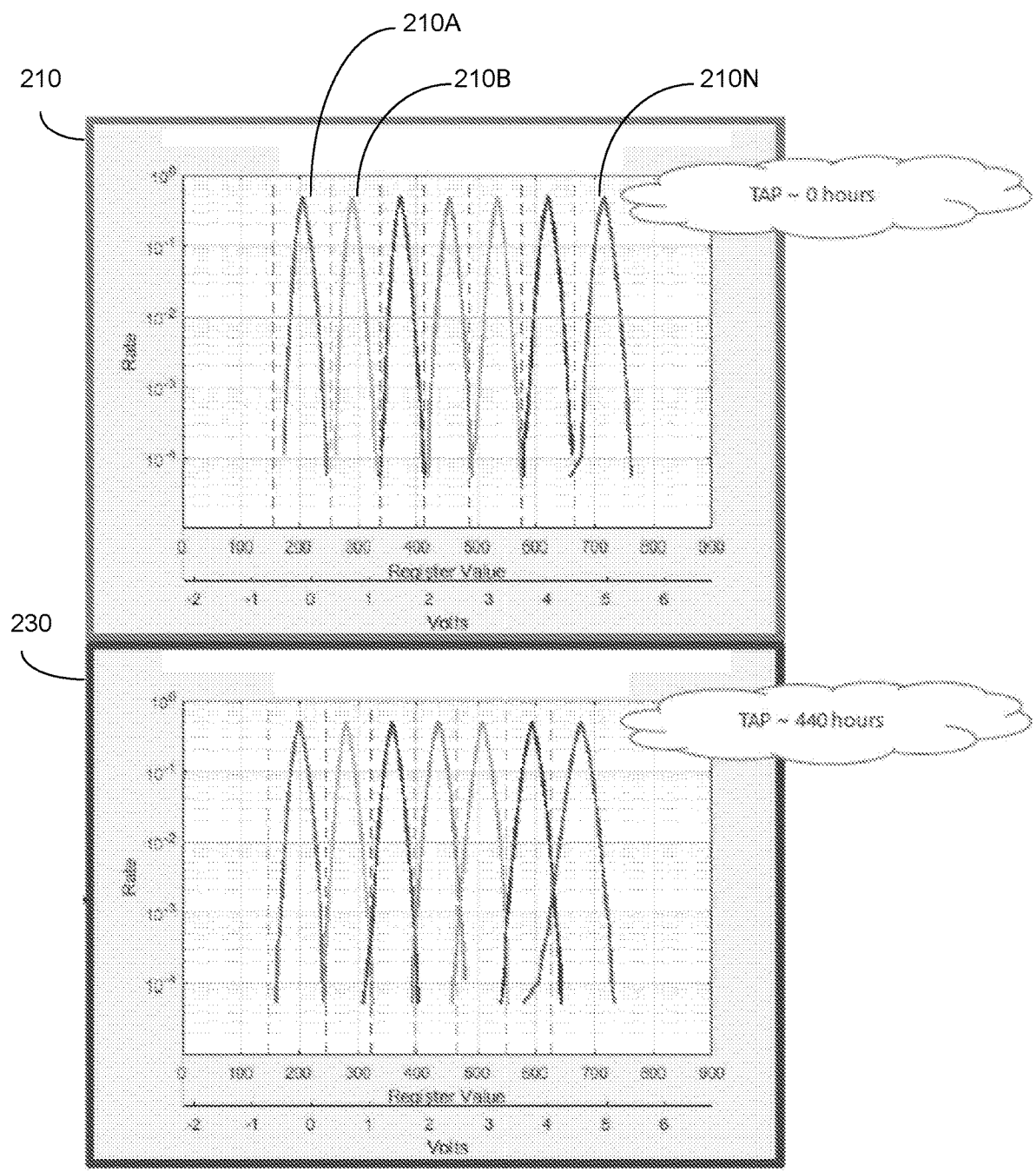
FIG. 2 schematically illustrates the temporal voltage shift caused by the slow charge loss exhibited by triple-level memory cells, in accordance with some embodiments of the present disclosure.

FIG. 2 schematically illustrates the temporal voltage shift caused by the slow charge loss exhibited by triple-level memory cells. While the illustrative example of FIG. 2 utilizes triple-level cells, the same observations can be made and, accordingly, the same remedial measures are applicable to single level cells and multi-level cells in order to compensate for the slow charge loss.

As noted herein above, a memory cell can be programmed (written to) by applying a certain voltage to the memory cell, which results in an electric charge being held by the memory cell, thus allowing modulation of the voltage distributions produced by the memory cell. Precisely controlling the amount of the electric charge stored by the memory cell allows to establish multiple threshold voltage levels corresponding to different logical levels, thus effectively allowing a single memory cell to store multiple bits of information: a memory cell operated with 2n different threshold voltage levels is capable of storing n bits of information.

In FIG. 2, each graph 220A-220N shows a voltage distribution produced by memory cells programmed by a respective write level (which can be assumed to be at the midpoint of the distribution) to encode a corresponding logical level ("000" through "111" in case of a TLC). In order to distinguish between neighboring distributions (corresponding to two different logical levels), the threshold voltage levels (shown by dashed vertical lines) are defined, such that any measured voltage that falls below a threshold level is associated with one distribution of the pair of neighboring distributions, while any measured voltage that is greater than or equal to the threshold level is associated with another distribution of the pair of neighboring distributions.

As seen from comparing example charts 210 and 230, which reflect the time periods immediately after programming and 440 hours after programming, respectively, the voltage distributions change in time due to the slow charge loss, which results in drifting values of the threshold voltage levels, which are shown by dashed vertical lines. In various embodiments of the present disclosure, the temporal voltage shift is selectively tracked for programmed blocks grouped by block families, and appropriate voltage offsets, which are based on block affiliation with a certain block family, are applied to the base read levels in order to perform read operations.

Figure 3:
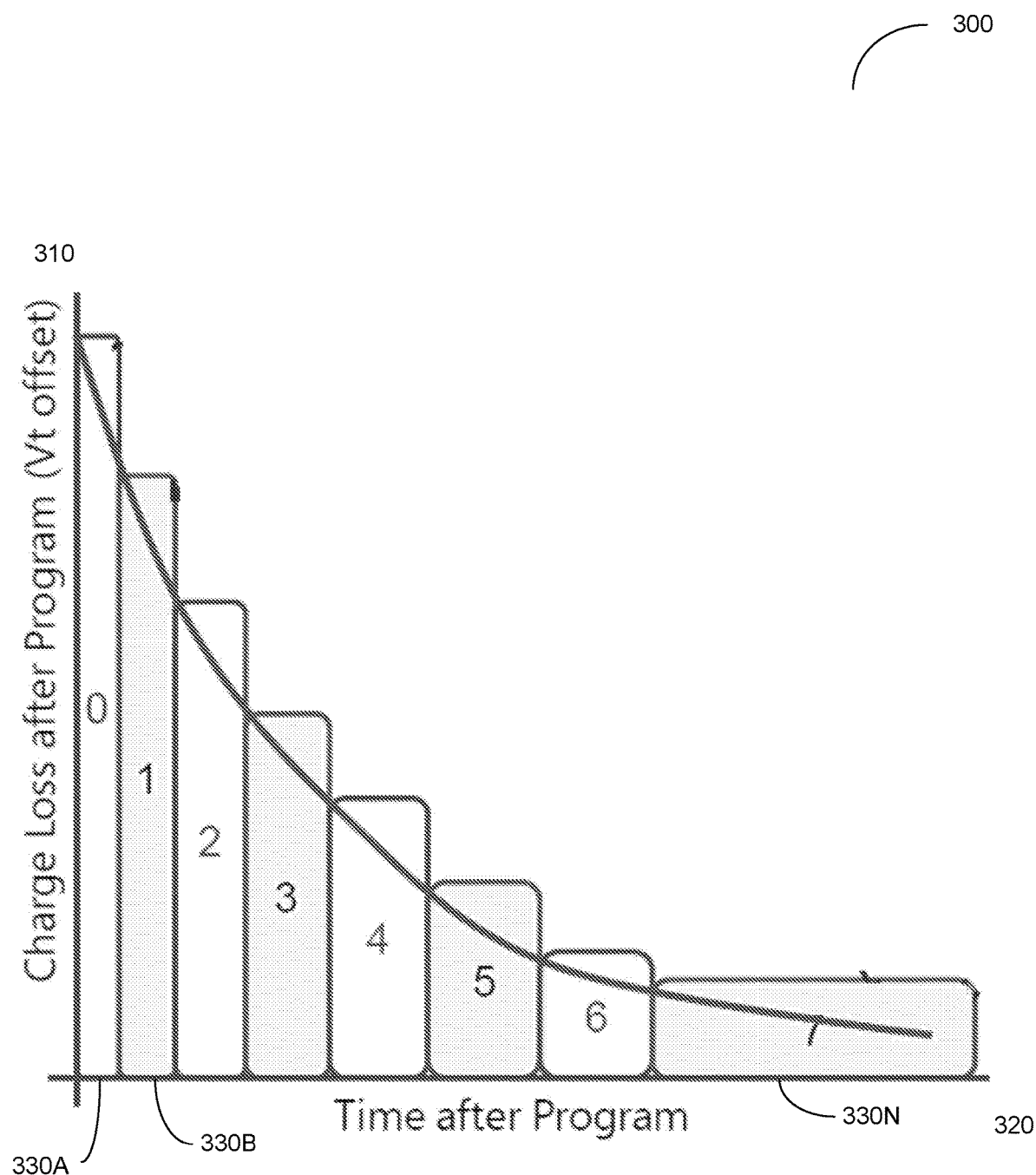
FIG. 3 depicts an example graph illustrating the dependency of the threshold voltage offset on the time after program (i.e., the period of time elapsed since the block had been programmed, in accordance with some embodiments of the present disclosure.

FIG. 3 depicts an example graph 300 illustrating the dependency of the threshold voltage offset 310 on the time after program 320 (i.e., the period of time elapsed since the block had been programmed. As schematically illustrated by FIG. 3, blocks of the memory device are grouped into block families 330A-330N, such that each block family includes one or more full or partial blocks that have been programmed within a specified time window and a specified temperature window. As noted herein above, since the time elapsed after programming and temperature are the main factors affecting the temporal voltage shift, all blocks and/or partitions within a single block family 310 are presumed to exhibit similar distributions of threshold voltages in memory cells, and thus would require the same voltage offsets for read operations.

Block families can be created asynchronously with respect to block programming events. In an illustrative example, the memory sub-system controller 115 of FIG. 1 can create a new block family whenever a specified period of time (e.g., a predetermined number of minutes) has elapsed since creation of the last block family or whenever the reference temperature of memory cells, which is updated at specified time intervals, has changed by more than a specified threshold value since creation of the current block family.

A newly created block family can be associated with bin 0. Then, the memory sub-system controller can periodically perform a calibration process in order to associate each die of every block family with one of the predefines threshold voltage offset bins (bins 0-7 in the illustrative example of FIG. 3), which is in turn associated with the voltage offset to be applied for read operations. The associations of blocks with block families and block families and dies with threshold voltage offset bins can be stored in respective metadata tables maintained by the memory sub-system controller.

Figure 4:
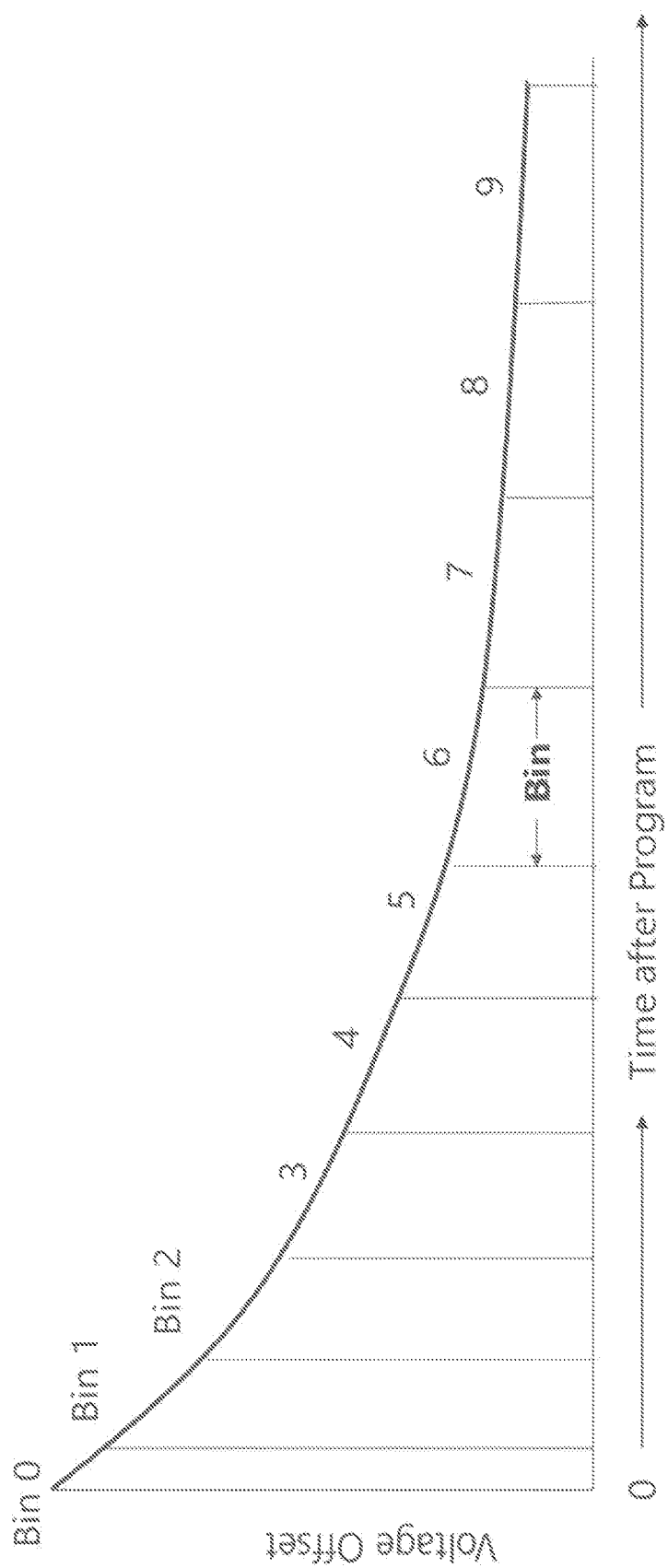
FIG. 4 schematically illustrates a set of predefined threshold voltage offset bins, in accordance with embodiments of the present disclosure.

FIG. 4 schematically illustrates a set of predefined threshold voltage offset bins (bin 0 to bin 9), in accordance with embodiments of the present disclosure. As schematically illustrated by FIG. 4, the threshold voltage offset graph can be subdivided into multiple threshold voltage offset bins, such that each bin corresponds to a predetermined range of threshold voltage offsets. While the illustrative example of FIG. 4 defines ten bins, in other implementations, various other numbers of bins can be employed (e.g., 64 bins). Based on a periodically performed calibration process, the memory sub-system controller associates each die of every block family with a threshold voltage offset bin, which defines a set of threshold voltage offsets to be applied to the base voltage read level in order to perform read operations, as described in more detail herein below.

Figure 5:
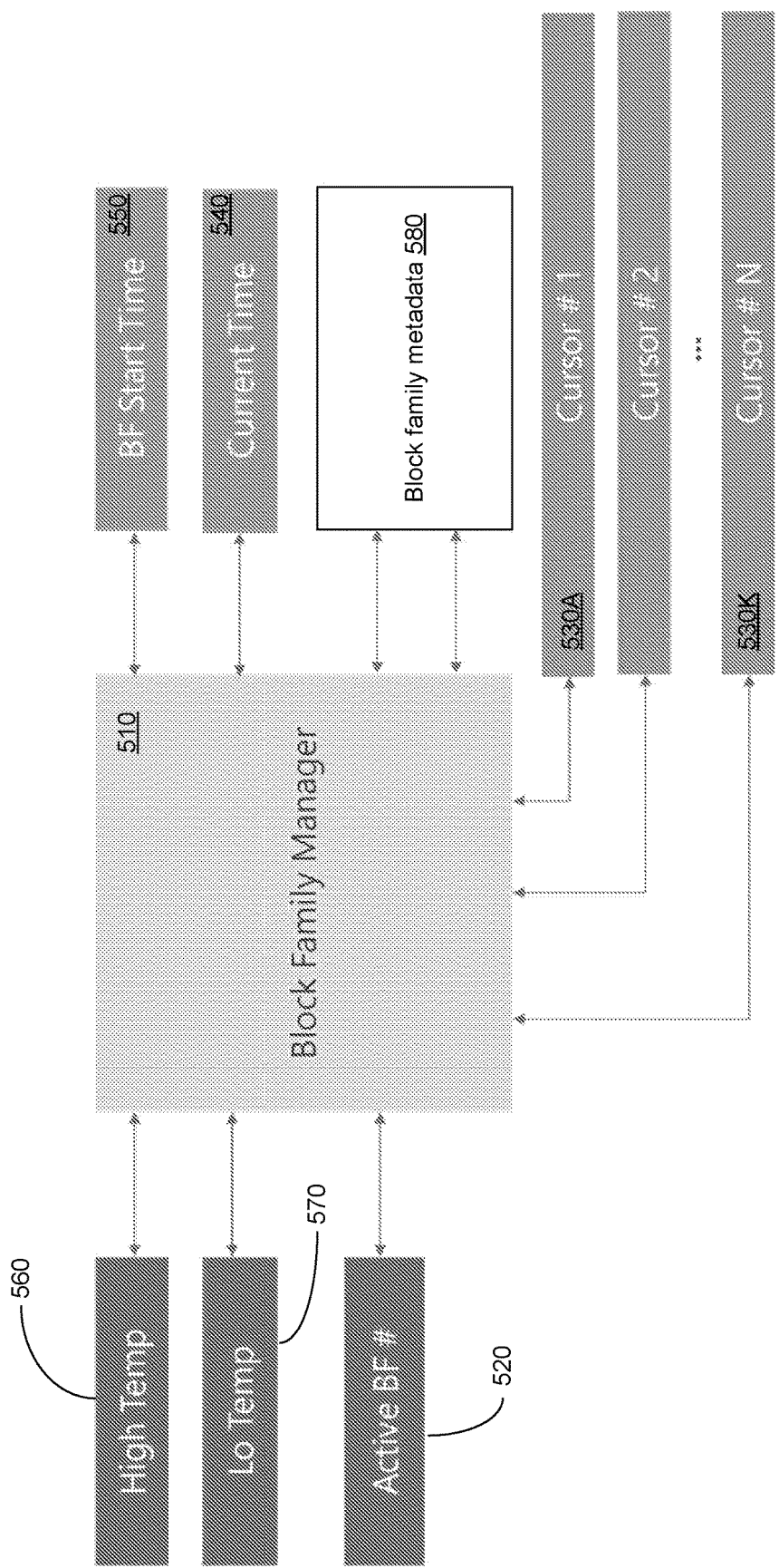
FIG. 5 schematically illustrates block family management operations implemented by the block family manager component of the memory-sub-system controller operating in accordance with embodiments of the present disclosure.

FIG. 5 schematically illustrates block family management operations implemented by the block family manager component of the memory-sub-system controller operating in accordance with embodiments of the present disclosure. As schematically illustrated by FIG. 5, the block family manager 510 can maintain, in a memory variable, an identifier 520 of the active block family, which is associated with one or more blocks of cursors 530A-530K as they are being programmed. "Cursor" herein shall broadly refer to a location on the memory device to which the data is being written.

The memory sub-system controller can utilize a power on minutes (POM) clock for tracking the creation times of block families. In some implementations, a less accurate clock, which continues running when the controller is in various low-power states, can be utilized in addition to the POM clock, such that the POM clock is updated based on the less accurate clock upon the controller wake-up from the low-power state.

Thus, upon initialization of each block family, the current time 540 is stored in a memory variable as the block family start time 550. As the blocks are programmed, the current time 540 is compared to the block family start time 550. Responsive to detecting that the difference of the current time 540 and the block family start time 550 is greater than or equal to the specified time period (e.g., a predetermined number of minutes), the memory variable storing the active block family identifier 520 is updated to store the next block family number (e.g., the next sequential integer number), and the memory variable storing the block family start time 550 is updated to store the current time 540.

The block family manager 510 can also maintain two memory variables for storing the high and low reference temperatures of a selected die of each memory device. Upon initialization of each block family, the high temperature 560 and the low temperature 570 variable store the value of the current temperature of the selected die of the memory device. In operation, while the active block family identifier 520 remains the same, temperature measurements are periodically obtained and compared with the stored high temperature 560 and the low temperature 570 values, which are updated accordingly: should the temperature measurement be found to be greater than or equal to the value stored by the high temperature variable 560, the latter is updated to store that temperature measurement; conversely, should the temperature measurement be found to fall below the value stored by the low temperature variable 570, the latter is updated to store that temperature measurement.

The block family manager 510 can further periodically compute the difference between the high temperature 560 and the low temperature 570. Responsive to determining that the difference between the high temperature 560 and the low temperature 570 is greater than or equal to a specified temperature threshold, the block family manager 510 can create a new active block family: the memory variable storing the active block family identifier 520 is updated to store the next block family number (e.g., the next sequential integer number), the memory variable storing the block family start time 550 is updated to store the current time 540, and the high temperature 560 and the low temperature 570 variables are updated to store the value of the current temperature of the selected die of the memory device.

At the time of programming a full or partial block, the memory sub-system controller associates the block (or its partition) with the currently active block family. In an illustrative example, since the programming is done on the page level, one subset of pages (partition) of a block can be programmed within a time period associated with one block family, while the next partition of the block can be programmed within the next time period, which is associated with another block family, etc. Accordingly, the association of each full or partial block with a corresponding block family is reflected by the block family metadata 580, which can be represented by a combination of a block family table and a linked list of groups, as described in more detail herein below with reference to FIGS. 7-9.

As noted herein above, based on a periodically performed calibration process, the memory sub-system controller associates each die of every block family with a threshold voltage offset bin, which defines a set of threshold voltage offsets to be applied to the base voltage read level in order to perform read operations. The calibration process involves performing, with respect to a specified number of randomly selected blocks within the block family that is being calibrated, read operations utilizing different threshold voltage offsets, and choosing the threshold voltage offset that minimizes the error rate of the read operation.

Figure 6:
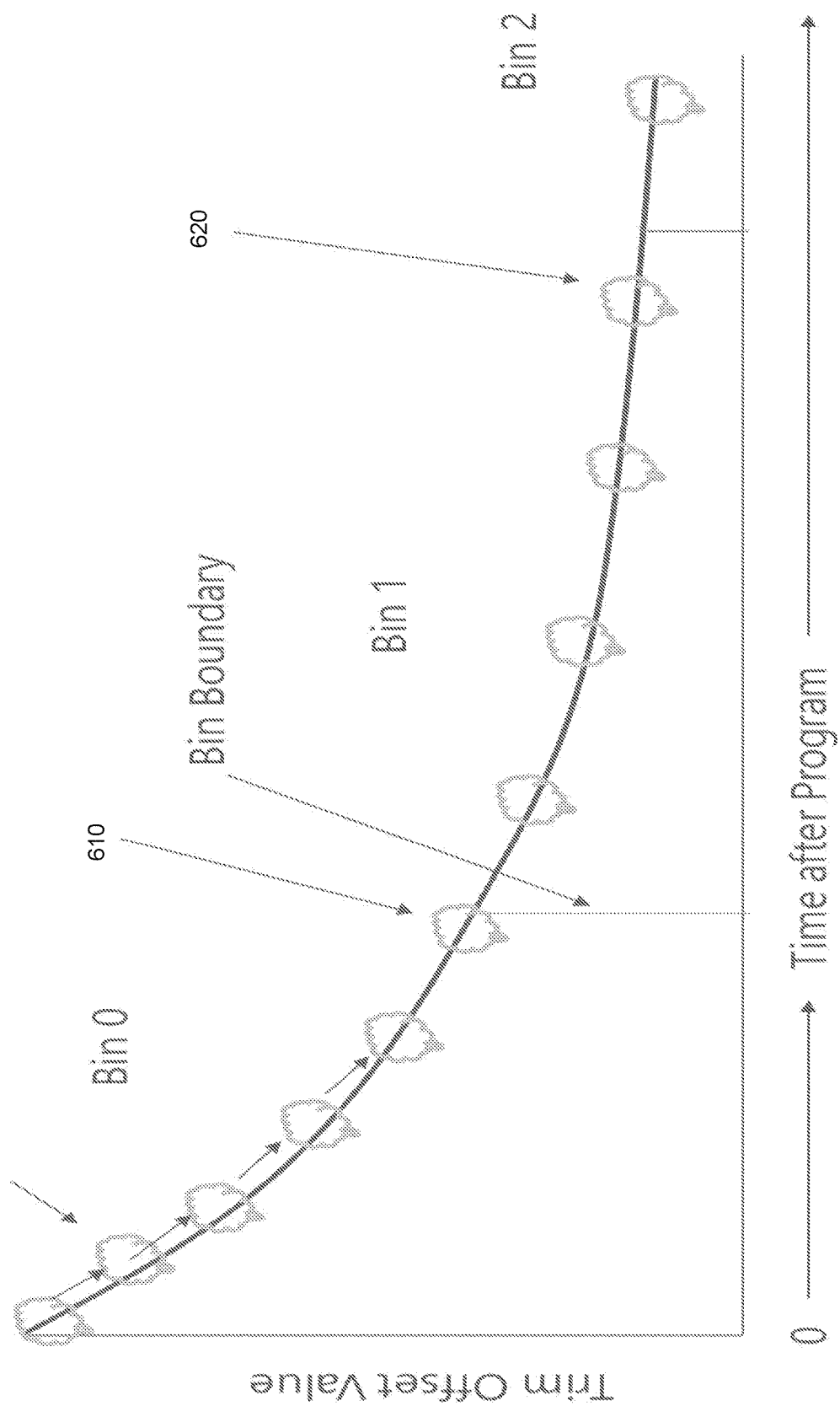
FIG. 6 schematically illustrates selecting block families for calibration, in accordance with embodiments of the present disclosure.

FIG. 6 schematically illustrates selecting block families for calibration, in accordance with embodiments of the present disclosure. As schematically illustrated by FIG. 6, the memory sub-system controller can limit the calibration operations to the oldest block family in each bin (e.g., block family 610 in bin 0 and block family 620 in bin 1), since it is the oldest block family that will, due to the slow charge loss, migrate to the next bin before any other block family of the current bin.

As noted herein above, the association of each full or partial block with a corresponding block family is reflected by the block family metadata, which can be represented by a combination of a block family table and a linked list of partition groups, which can be utilized for identifying, for a given page or set of pages, the associated block family and the corresponding threshold voltage offset bin for performing a read operation.

Figure 7:
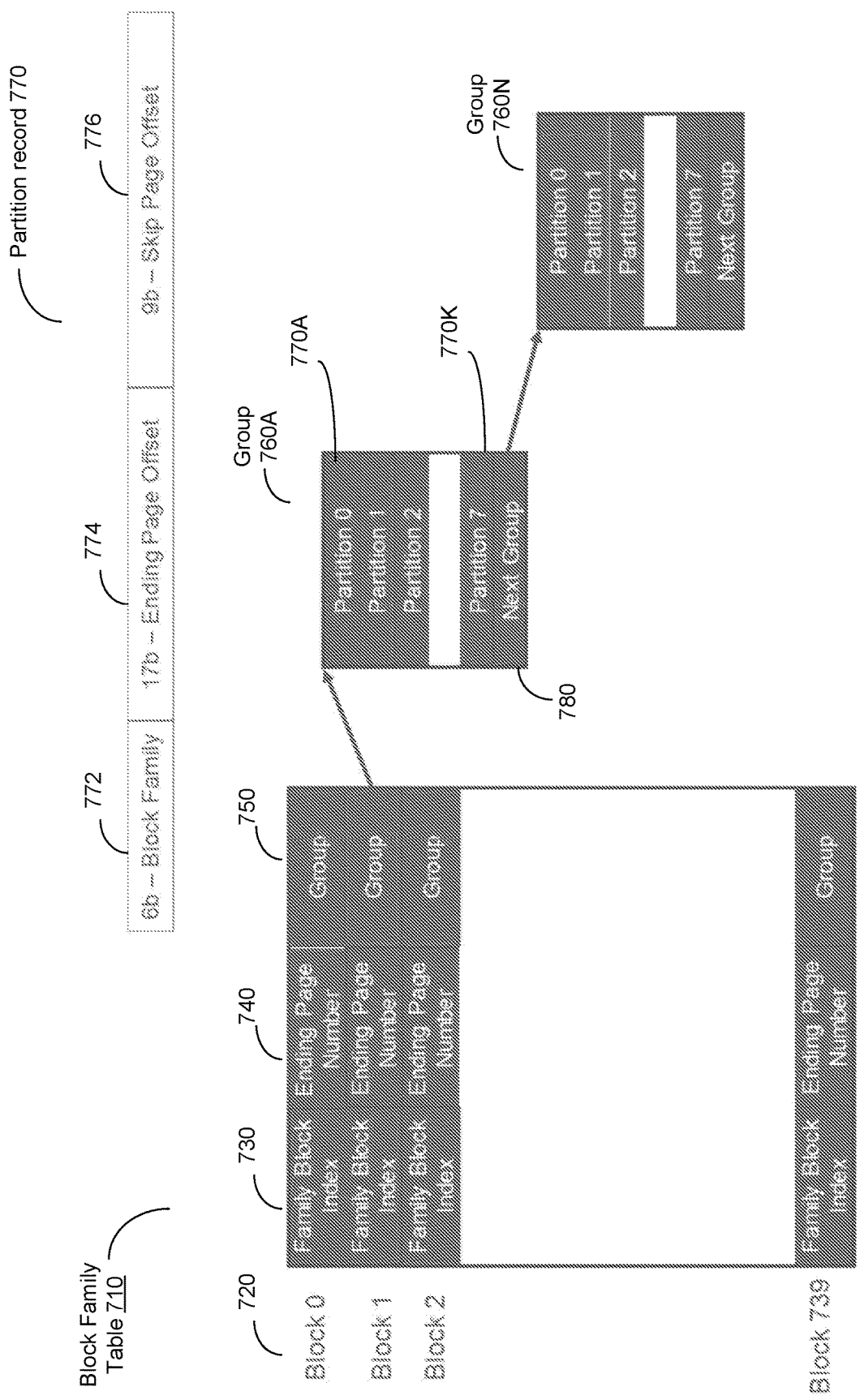
FIG. 7 schematically illustrates example metadata maintained by the memory sub-system controller for associating block partitions with block families, in accordance with embodiments of the present disclosure.

FIG. 7 schematically illustrates example metadata maintained by the memory sub-system controller for associating block partitions with block families, in accordance with embodiments of the present disclosure. As schematically illustrated by FIG. 7, the memory sub-system controller can maintain the block family table 710, which is indexed by the block number 720. Each record of the block family table 710 specifies, for the block referenced by the index of the record, an identifier 730 of the block family associated with the continuous set of pages of the block, in which the page number does not exceed the ending page number 740 specified by the record. In other words, i-th record of the block family table 710 maps at least a subset of pages of the i-th block to the block family 730 specified by the i-th record, such that the subset of pages includes the pages having their respective page numbers from 0 to the ending page number 740 specified by the i-th record.

The null value of the group field 750 indicates that no more partitions are currently associated with the block. Unless ending page number 740 specifies the last page of the block (i.e., the ending page number is equal to the number of pages in the block minus one), the flash translation layer may, upon programming the next subset of pages of the block, associate those pages with the then current block family, and reflect the association by creating a new partition (which would involve creating the first partition group 760A).

As noted herein above, since the programming is done on the page level, the first subset of pages (partition) of a block can be programmed within a time period associated with one block family, while the next partition of the block can be programmed within the next time period, which is associated with another block family, etc. Accordingly, the remaining pages of the i-th block (i.e., the pages having the page numbers exceeding the value specified by the ending page number 740) can be split into one or more continuous sets of pages (partitions), such that each partition including one or more pages is associated with a respective block family.

The partitions of a given block (except for the first partition starting at page number 0 including ending page number—1 pages) are grouped into partition groups 760A-760N, which are organized in a linked list, such that the first group of partitions 760A of a given block is referenced by the group filed 750 of the block family table 710, and each group of partitions (e.g., group 760A) references the next group of partitions (e.g., group 760N) associated with the given block.

Each group 760 includes up to a predetermined number (e.g., seven) of partitions 770A-770K. For each partition 770, the group table 760 specifies its block family association 772, its ending page offset 774, and the skip page offset 776 for implementing the binary search within the group.

Each partition record 770 record of the group table 760 specifies, for the partition referenced by the index of the record, an identifier 772 of the block family associated with the partition, and the ending page number 774 of the partition. In other words, each record of the group table 760 maps a corresponding partition to the block family 772 specified by the record, such that the partition includes the pages which have the numbers from the ending page of the previous partition to the ending page of the current partition minus one.

The null value of the next group field 770 indicates that no more partitions are currently associated with the block. Unless ending page number 776 of the last partition of the current partition group 760A specifies the last page of the block (i.e., the ending page number is equal to the number of pages in the block minus one), the flash translation layer may, upon programming the next subset of pages of the block, associate those pages with the then current block family, and reflect the association by creating a new partition (which would involve creating a new partition group 760N and linking it to the current partition group 760A by setting the next group field 770 of the current partition group 760A to point to the next partition group 760N).

The skip page offset field 776 specifies the offset to be added to the ending page number 774 in order to determine the page number corresponding to the midpoint of the remaining partitions of the group, thus allowing implementing of a binary search within the group. Accordingly, the computation complexity of searching a given page number within a group would not exceed ceil($\log_2$(M)), where M specifies the number of partitions within a single group 760 and ceil(x) is a function that returns the smallest integer that is equal to or exceeds its argument x. In the illustrative example of FIG. 7 the number of partitions within a group is 7, and thus the computation complexity of searching a given page number within a group would not exceed ceil($\log_2 7$)=3.

The correct group can be identified by walking the linked list of groups, starting with the first group. If the specified page number is less than or equal to the ending page number of the group, the current group is searched for identifying the partition which includes the specified page number. Otherwise, should the specified page number exceed the ending page number, the next group (identified by field 780 of the group table 760) is searched. As identifying the group requires a linked list walk, the overall computational complexity of identifying the block family corresponding to a given page number is a linear function of the number of groups.

As noted herein above, upon identifying the block family associated with a given page or set of pages, the memory sub-system controller can identify the threshold voltage offset bin associated with the block family and die on which the block resides, compute the new threshold voltage by additively applying the threshold voltage offset associated with the threshold voltage offset bin to the base read level, and perform the read operation using the new threshold voltage.

FIG. 8 schematically illustrates example metadata maintained by the memory sub-system controller for associating block families with voltage offset bins and corresponding threshold voltage offsets, in accordance with embodiments of the present disclosure. As schematically illustrated by FIG. 8, the memory sub-system controller can maintain the bin table 810 and the offset table 820.

The bin table 810 is indexed by the block family number, such that each record of the bin table 810 specifies, for the block family referenced by the index of the record, a set of threshold voltage offset bins associated with respective dies of the block family. In other words, each record of the bin table 810 includes a vector, each element of which specifies the threshold voltage offset bin associated with the die referenced by the index of the vector element. The threshold voltage offset bins to be associated with the block family dies can be determined by the calibration process, as described in more detail herein above.

Finally, the offset table 820 is indexed by the bin number. Each record of the offset table 820 specifies a set of threshold voltage offsets (e.g., for TLC, MLC, and/or SLC) associated with threshold voltage offset bin.

The metadata tables 710, 769, 810, and 820 can be stored on one or more memory devices 130 of FIG. 1. In some implementations, at least part of the metadata tables can be cached in the local memory 119 of the memory sub-system controller 115 of FIG. 1.

In operation, upon receiving a read command, the memory sub-system controller determines the physical address corresponding to the logical block address (LBA)

specified by the read command. Components of the physical address, such as the physical block number, page number and the die identifier, are utilized for performing the metadata table walk: first, the block family table 710 and group tables 760A-760N is used to identify the block family identifier corresponding to the physical block number and the page number. Then, the block family identifier is used as the index to the bin table 810 in order to determine the threshold voltage offset bin associated with the block family and the die; finally, the identified threshold voltage offset bin is used as the index to the offset table 820 in order to determine the threshold voltage offset corresponding to the bin. The memory sub-system controller can then additively apply the identified threshold voltage offset to the base voltage read level in order to perform the requested read operation.

In the illustrative example of FIG. 8, the block family 4 is utilized as the index to the family table 820 in order to determine that die 0 is mapped to bin 3. The latter value is used as the index to the offset table in order to determine the threshold voltage offset values for bin 3.

Figure 9:
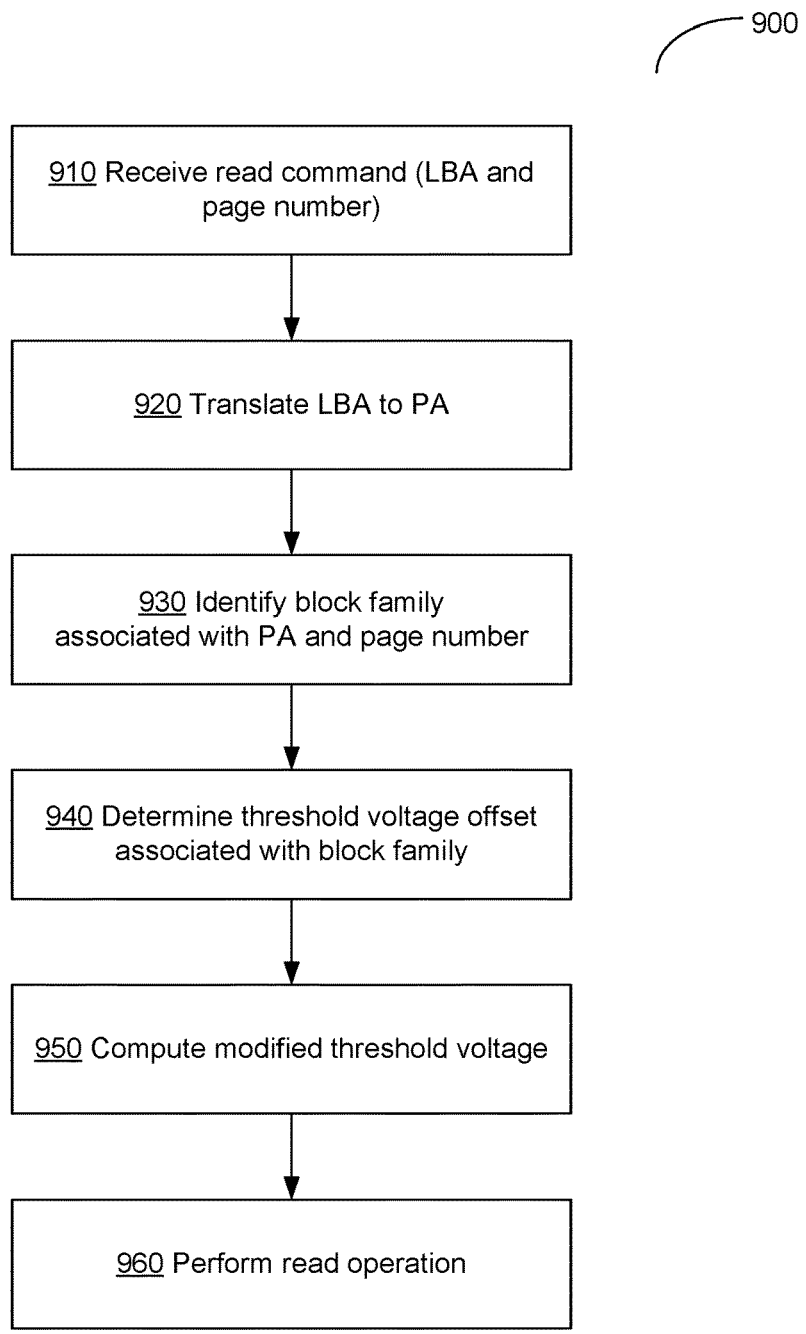
FIG. 9 is a flow diagram of an example method of performing a read operation by a memory sub-system controller operating in accordance with some embodiments of the present disclosure.

FIG. 9 is a flow diagram of an example method of performing a read operation by a memory sub-system controller operating in accordance with some embodiments of the present disclosure. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900 is performed by the block family manager component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 910, the processing device of the memory sub-system controller receives a read command specifying a logical address of a page to be read. The logical address can include a logical block address (LBA) of the logical block containing the page, and the page number within the block.

At operation 920, the processing device translates the logical address into a physical address (PA) of a block stored on the memory device. In an illustrative example, the translation involves looking up the LBA in a logical-to-physical (L2P) table associated with the memory device. The L2P table includes multiple mapping records, such that each mapping record maps an LBA to a corresponding physical block address. For flash memory devices, the physical address can include channel identifier, die identifier, page identifier, plane identifier and/or frame identifier.

At operation 930, the processing device identifies, based on block family metadata associated with the memory device, a block family associated with the physical address computed at operation 920 and the page number specified by the read command. In an illustrative example, the processing device utilizes the block family table 710 and the associated group tables 760A-760N of FIG. 7 in order to identify the block family associated with the physical address, as described in more detail herein below with reference to FIG. 10.

At operation 940, the processing device determines a threshold voltage offset associated with the block family and the memory device die. In an illustrative example, the processing device utilizes the block bin table 810 of FIG. 8, in order to determine the bin identifier corresponding to the combination of the block family identifier and the die identifier. The processing device then utilizes the offset table 820 of FIG. 8 in order to determine the threshold voltage offsets for the identified threshold voltage offset bin.

At operation 950, the processing device computes a modified threshold voltage by applying the identified threshold voltage offset to a base read level voltage associated with the memory device. As noted herein above, the base read level voltage can be stored in the metadata area of the memory device.

At operation 960, the processing device utilizes the computed modified threshold voltage in order to perform the requested read operation. Responsive to completing operation 960, the method terminates.

Figure 10:
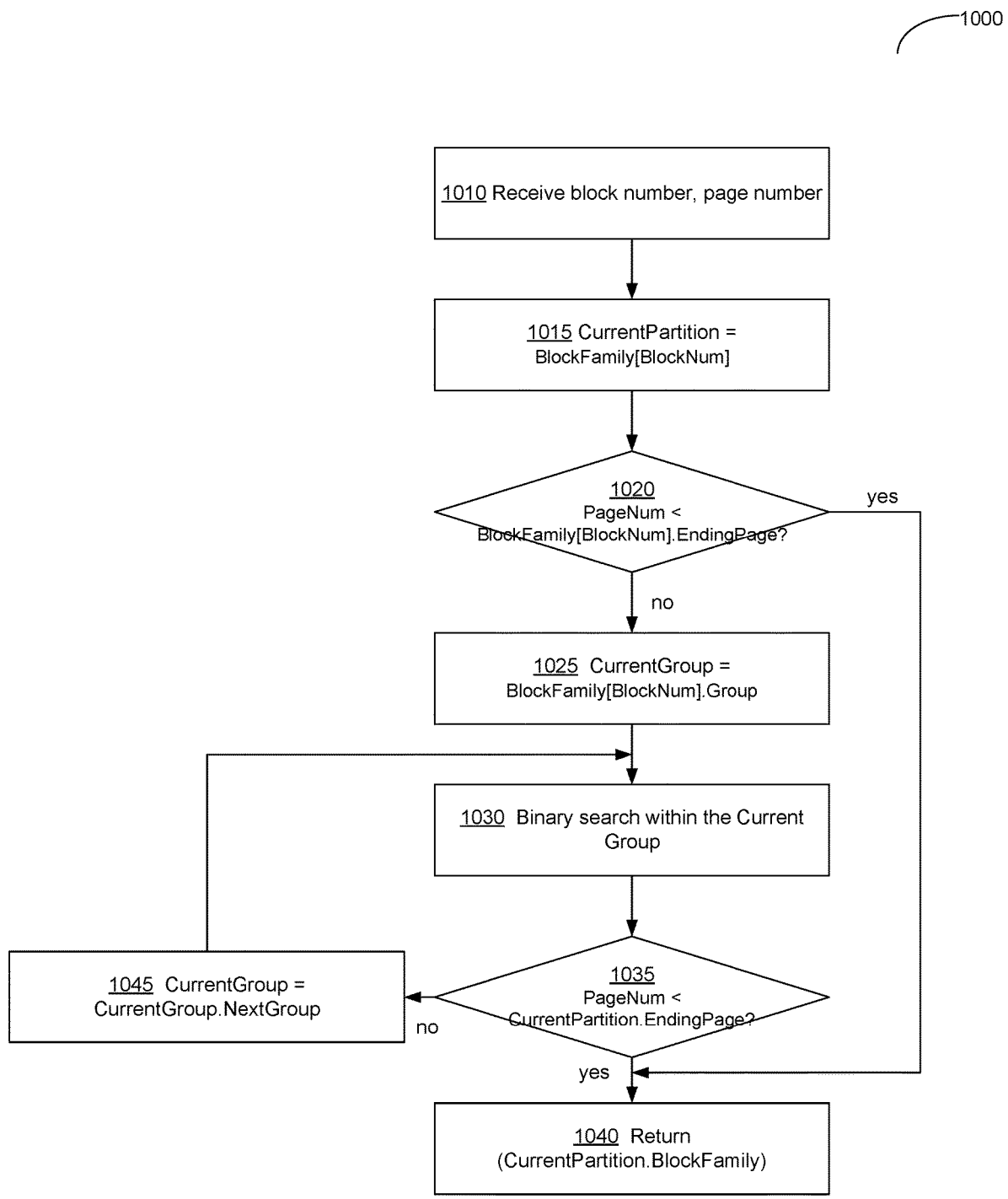
FIG. 10 is a flow diagram of an example method of identifying the block family associated with a specified page, implemented by a memory sub-system controller operating in accordance with some embodiments of the present disclosure.

FIG. 10 is a flow diagram of an example method of identifying the block family associated with a specified page, implemented by a memory sub-system controller operating in accordance with some embodiments of the present disclosure. The method 1000 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1000 is performed by the block family manager component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 1010, the processing device of the memory sub-system controller receives a physical block number and a page number within the block. In an illustrative example, the physical block number can be produced by the flash translation layer based on an LBA specified by a read command received by the memory sub-system controller, as described in more detail herein above.

At operation 1015, the processing device utilizes the physical block number as an index into the block family table associated with the memory device, thus identifying a block family record associated with the physical block number.

Responsive to determining, at operation 1020, that the input page number is less than or equal to the ending page number specified by the identified family block record, the method branches to operation 1040. Otherwise, the processing continues at operation 1025.

At operation 1025, the processing device initializes the current group pointer to point to the first partition group referenced by the group filed of the family block record.

At operation 1030, the processing device performs the binary search within the current group. The skip page offset field of each partition record specifies the offset to be added to the ending page number in order to determine the page number corresponding to the midpoint of the remaining partitions of the group, should the current partition fail to contain the input page number.

Responsive to determining, at operation 1035, that the input page number is less than or equal to the ending page number of the current partition, the processing continues at operation 1040; otherwise, the method branches to operation 1045 to set the current group pointer to point to the next group and loop back to operation 1030.

At operation 1040, the method returns the block family index associated with the current partition, which is then used for identifying the threshold voltage bin and associated threshold voltage offset, as described in more detail herein above.

Figure 11:
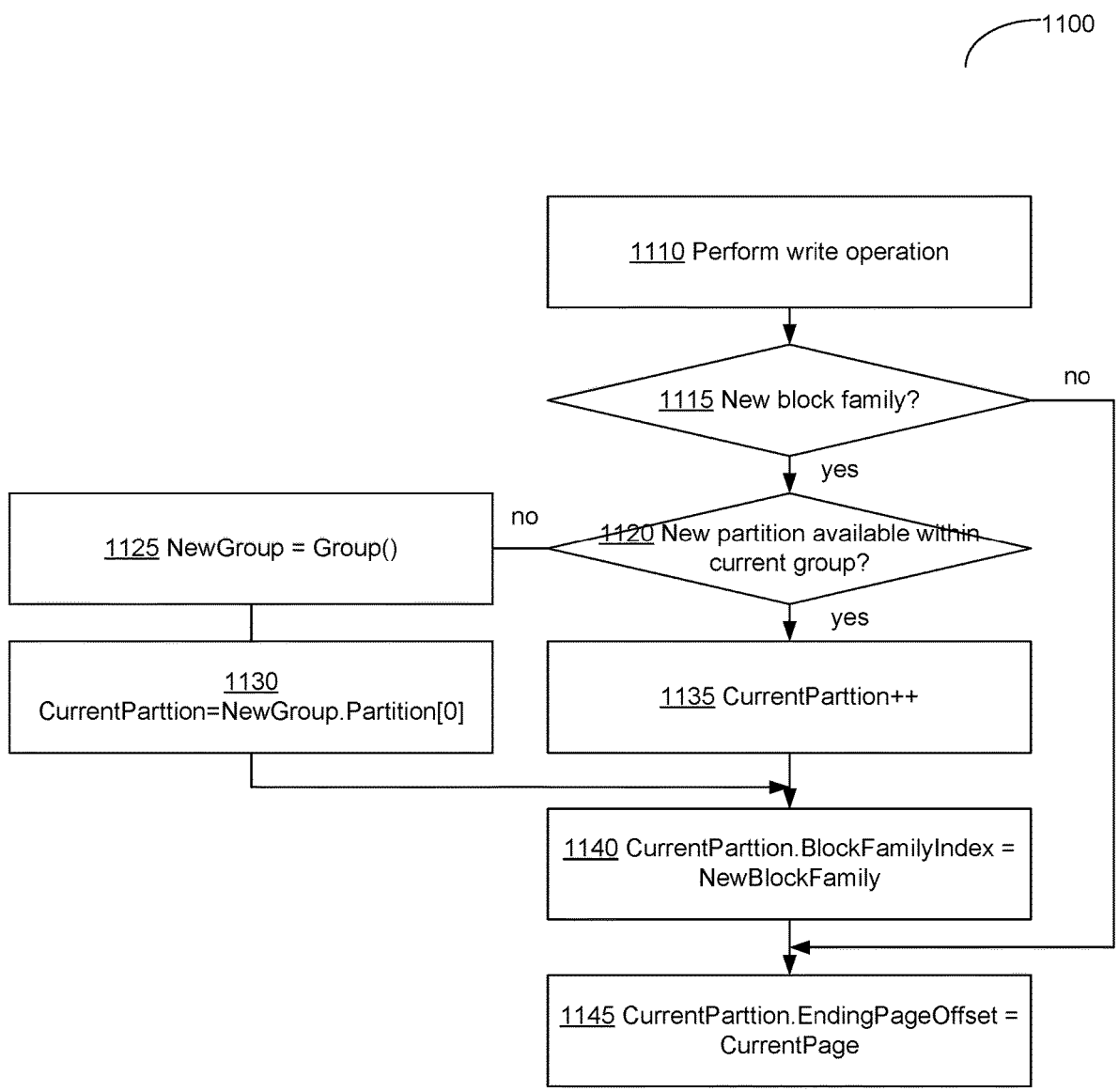
FIG. 11 is a flow diagram of an example method of performing a write operation, implemented by a memory sub-system controller operating in accordance with some embodiments of the present disclosure

FIG. 11 is a flow diagram of an example method of performing a write operation, implemented by a memory sub-system controller operating in accordance with some embodiments of the present disclosure. The method 1100 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1100 is performed by the block family manager component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 1110, the processing device of the memory sub-system controller performs a write operation to write a data page to a physical memory device.

Responsive to determining, at operation 1115, that the data page should be associated with a new block family, the processing continues at operation 1120; otherwise, the method branches to operation 1145. The determination of the new block family can be performed based on the time elapsed since programming the previous page of the current cursor and/or the temperature shifting outside of the temperature window associated with the current block family of the current cursor.

Responsive to determining, at operation 1120, that a new partition is available within the current partition group associated with the current cursor, the processing continues at operation 1135 by the processing device incrementing the current partition number, and the processing continues at operation 1140.

Otherwise, responsive to determining, at operation 1120, that no new partitions are available within the current partition group associated with the current cursor, the processing device, at operation 1125, creates a new partition group associated with the current cursor, and, at operation 1130, initializes the current partition pointer to reference the first partition of the newly created partition group. Creating the new partition group involves updating the next group pointer of the current group to reference the newly created group; updating the next group pointer of the current group to the null value to indicate that this is the last partition group of the linked list associated with the physical block. The processing continues at operation 1140.

At operation 1140, the processing device sets the block family index of the current partition to reference the new block family.

At operation 1145, the processing device sets the ending page offset of the current partition to reference the page that has just been programmed, and the method terminates.

Figure 12:
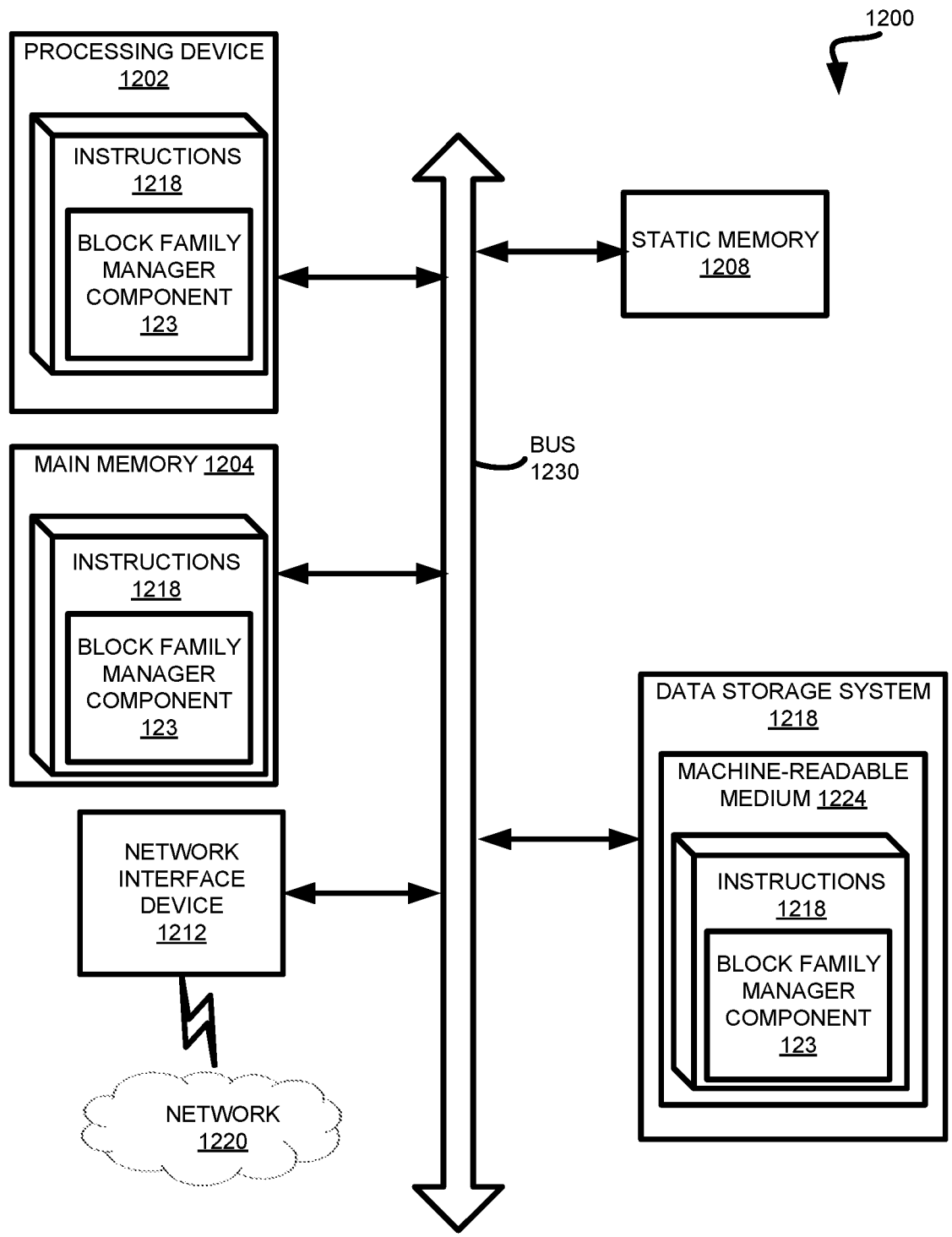
FIG. 12 is a block diagram of an example computer system in which embodiments of the present disclosure can operate.

FIG. 12 illustrates an example machine of a computer system 1200 within which a set of instructions, for causing the machine to perform any one or more of the methodologies discussed herein, can be executed. In some embodiments, the computer system 1200 can correspond to a host system (e.g., the host system 120 of FIG. 1) that includes, is coupled to, or utilizes a memory sub-system (e.g., the memory sub-system 112 of FIG. 1) or can be used to perform the operations of a controller (e.g., to execute an operating system to perform operations corresponding to the block family manager component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1200 includes a processing device 1202, a main memory 1204 (e.g., read-only memory (ROM), flash memory, dynamic random access memory (DRAM) such as synchronous DRAM (SDRAM) or Rambus DRAM (RDRAM), etc.), a static memory 1212 (e.g., flash memory, static random access memory (SRAM), etc.), and a data storage system 1218, which communicate with each other via a bus 1230.

Processing device 1202 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1202 can also be one or more special-purpose processing devices such as an application specific integrated circuit (ASIC), a field programmable gate array (FPGA), a digital signal processor (DSP), network processor, or the like. The processing device 1202 is configured to execute instructions 1228 for performing the operations and steps discussed herein. The computer system 1200 can further include a network interface device 1212 to communicate over the network 1220.

The data storage system 1218 can include a machine-readable storage medium 1224 (also known as a computer-readable medium) on which is stored one or more sets of instructions 1228 or software embodying any one or more of the methodologies or functions described herein. The instructions 1228 can also reside, completely or at least partially, within the main memory 1204 and/or within the processing device 1202 during execution thereof by the computer system 1200, the main memory 1204 and the processing device 1202 also constituting machine-readable storage media. The machine-readable storage medium 1224, data storage system 1218, and/or main memory 1204 can correspond to the memory sub-system 112 of FIG. 1.

In one embodiment, the instructions 1228 include instructions to implement functionality corresponding to the block family manager component 113 of FIG. 1. While the machine-readable storage medium 1224 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
 a memory device; and
 a processing device, operatively coupled to the memory device, the processing device to perform operations, comprising:
  initializing a block family associated with the memory device;
  responsive to determining that no new partitions are available within a current partition group associated with the memory device, creating a new partition group associated with the memory device;
  setting a first partition of the new partition group as a current partition;
  setting a block family index of the current partition to reference the block family; and
  setting an ending page offset of the current partition to reference a page associated with the block family.

2. The system of claim 1, wherein the block family comprises a plurality of blocks that have been programmed within a specified time window.

3. The system of claim 1, wherein the block family comprises a plurality of blocks that have been programmed within a specified temperature window.

4. The system of claim 1, wherein the operations further comprise:
 identifying a threshold voltage offset associated with the block family;
 computing a modified threshold voltage by applying the threshold voltage offset to a base read level voltage associated with the memory device; and
 reading, using the modified threshold voltage, the page.

5. The system of claim 1, wherein creating the new partition group further comprises:
 updating a next group pointer of the current partition group to reference the new partition group.

6. The system of claim 1, wherein creating the new partition group further comprises:
 updating a next group pointer of the new partition group to a null value.

7. The system of claim 1, wherein initializing the block family is performed responsive to a write operation with respect to the page.

8. A computer-readable non-transitory storage medium comprising executable instructions that, when executed by a processing device, cause the processing device to perform operations, comprising:
- initializing a block family associated with a memory device;
- responsive to determining, that no new partitions are available within a current partition group associated with the memory device, creating a new partition group associated with the memory device;
- setting a first partition of the new partition group as a current partition;
- setting a block family index of the current partition to reference the block family; and
- setting an ending page offset of the current partition to reference a page associated with the block family.

9. The computer-readable non-transitory storage medium of claim 8, wherein the block family comprises a plurality of blocks that have been programmed within a specified time window.

10. The computer-readable non-transitory storage medium of claim 8, wherein the block family comprises a plurality of blocks that have been programmed within a specified temperature window.

11. The computer-readable non-transitory storage medium of claim 8, wherein the operations further comprise:
- identifying a threshold voltage offset associated with the block family;
- computing a modified threshold voltage by applying the threshold voltage offset to a base read level voltage associated with the memory device; and
- reading, using the modified threshold voltage, the page.

12. The computer-readable non-transitory storage medium of claim 8, wherein creating the new partition group further comprises:
- updating a next group pointer of the current partition group to reference the new partition group.

13. The computer-readable non-transitory storage medium of claim 8, wherein creating the new partition group further comprises:
- updating a next group pointer of the new partition group to a null value.

14. The computer-readable non-transitory storage medium of claim 8, wherein initializing the block family is performed responsive to a write operation with respect to the page.

15. A method, comprising:
- initializing, by a processing device, a block family associated with a memory device;
- responsive to determining, that no new partitions are available within a current partition group associated with the memory device, creating a new partition group associated with the memory device;
- setting a first partition of the new partition group as a current partition;
- setting a block family index of the current partition to reference the block family; and
- setting an ending page offset of the current partition to reference a page associated with the block family.

16. The method of claim 15, wherein the block family comprises a plurality of blocks that have been programmed within a specified time window.

17. The method of claim 15, wherein the block family comprises a plurality of blocks that have been programmed within a specified temperature window.

18. The method of claim 15, further comprising:
- identifying a threshold voltage offset associated with the block family;
- computing a modified threshold voltage by applying the threshold voltage offset to a base read level voltage associated with the memory device; and
- reading, using the modified threshold voltage, the page.

19. The method of claim 15, wherein creating the new partition group further comprises:
- updating a next group pointer of the current partition group to reference the new partition group.

20. The method of claim 15, wherein creating the new partition group further comprises:
- updating a next group pointer of the new partition group to a null value.

* * * * *